United States Patent [19]

Wery et al.

[11] Patent Number: 4,778,556

[45] Date of Patent: Oct. 18, 1988

[54] APPARATUS FOR CORRECTING PRINTED CIRCUIT BOARDS

[75] Inventors: Jean C. Wery, Jalhay; Michel Jehay, Blegny-Trembleur; Andre Job, Angleur, all of Belgium

[73] Assignee: Unisys Corporation, Blue Bell, Pa.

[21] Appl. No.: 930,622

[22] Filed: Nov. 14, 1986

Related U.S. Application Data

[60] Division of Ser. No. 857,510, Apr. 21, 1986, abandoned, which is a continuation of Ser. No. 588,878, Feb. 22, 1984, abandoned.

[51] Int. Cl.$^4$ .............................................. B32B 31/14
[52] U.S. Cl. .................. 156/379.6; 156/94; 156/272.2; 156/273.7; 156/273.9; 156/275.7; 156/379.7; 156/380.4; 29/402.09; 29/829; 29/843; 29/850; 29/874; 219/10.81; 219/56.1; 219/119
[58] Field of Search ............... 156/272.2, 273.7, 273.9, 156/275.7, 380.3, 380.4, 379.6, 379.7, 521, 530; 29/402.09, 829, 843, 850, 874; 228/179; 339/17 C; 219/10.53, 10.81, 56.1, 56.22, 119

[56] References Cited

U.S. PATENT DOCUMENTS

| | | | |
|---|---|---|---|
| 3,775,579 | 11/1973 | Burghart et al. | 219/56.1 |
| 3,786,172 | 1/1974 | Conley | 339/17 C |
| 3,795,047 | 3/1974 | Abolafia et al. | 156/273.9 |
| 3,896,285 | 7/1975 | Delorme | 219/56.1 |
| 4,016,025 | 4/1977 | Peterson | 219/10.81 |
| 4,104,109 | 8/1978 | Grau et al. | 156/521 |
| 4,230,925 | 10/1980 | Lascelles | 219/56.1 |
| 4,351,468 | 9/1982 | Floury et al. | 219/56.1 |
| 4,465,913 | 8/1984 | Stokoe et al. | 219/56.1 |

FOREIGN PATENT DOCUMENTS

| | | | |
|---|---|---|---|
| 712245 | 6/1965 | Canada | 219/56.1 |

*Primary Examiner*—Caleb Weston
*Attorney, Agent, or Firm*—Mark T. Starr

[57] ABSTRACT

A method and apparatus are shown for use in adding electrical connections to existing printed circuit boards. To this end, apparatus in the form of a multilayered pad is provided which has an adhesive layer over at least part of one face which is responsive to heat so that the pad can be bonded by heat to the surface of a printed circuit board. The other face of the pad includes a layer of stainless steel to which nickel wire can be stitched, or welded. A method according to the invention includes cutting a sheet of pads into individual pads, placing a plurality of pads, adhesive side down, on the surface of a printed circuit board, heating the pads to bond them to the board, and stitching (welding) wire to a succession of pads to complete a series of new connections. Some pads include plated-through-holes enabling connections to be completed from the pads to existing circuitry on the boards and to components mounted in the holes by the use of flow soldering techniques.

4 Claims, 7 Drawing Sheets

APPARATUS FOR CORRECTING PRINTED CIRCUIT BOARDS

CROSS-REFERENCE TO RELATED APPLICATION

Reference is made to application Ser. No. 867,908, filed May 20, 1985 (now U.S. Pat. No. 4,654,102 issued Mar. 31, 1987), which is a continuation of application Ser. No. 666,744, filed Oct. 31, 1984, (now abandoned), which is a division of parent application Ser. No. 588,878, filed Feb. 22, 1984, (now abandoned). The present application is a division of Ser. No. 857,510 filed Apr. 21, 1986, (now abandoned), which is a continuation of the aforementioned parent application Ser. No. 588,878, filed Feb. 22, 1984.

BACKGROUND OF THE INVENTION

1. Field of The Invention

The present invention relates to a method and apparatus for enabling the modification or correction of printed circuit boards by adding interconnections to existing boards. It relates particularly to apparatus, herein called stitching-pads, for use on printed circuit boards to enable new electrical connections to be made. It relates further to apparatus and methods for fabricating such pads and for using such pads to provide bases on printed circuit boards to which connections may be welded in order to modify interconnections between existing electrical circuitry on such boards.

2. DESCRIPTION OF THE PRIOR ART

In order to correct an existing printed circuit board, or to implement engineering instructions for changes to such an existing printed circuit board, it is necessary either to change connections, as by adding or deleting connections, between certain connection points on the printed circuit board or to redo the artwork for the printed circuit board. Adding wire connections from point-to-point on a board appears, on its face, to involve simple and straight-forward procedures, but has not been done satisfactorily in the past. Redoing the artwork is expensive, in that existing inventory must be scrapped, and it is time consuming, in that normal lead times approximate 14–16 weeks. Redoing the artwork is, in any case, not practical for only one or a few boards.

A system currently on the market for making corrections to existing printed circuit boards by redoing the artwork is marketed by Additive Technology Corporation, a Massachusetts company. In that system the printed circuit board is re-etched on a dielectric applied over existing circuitry to implement the corrections or engineering instructions. That method is expensive in that it is priced at several dollars per board with an initial set-up charge of several hundred dollars. It has been determined that that system is not cost effective for runs of fewer than 50,000 boards. The turn-around time is too long for many purposes, since it is approximately three weeks.

A system for adding connections is marketed by Augat. This system employs a printed circuit board of special construction which is faced by a stainless steel sheet to which wire is stitched, as by welding. The wire utilized is formed of nickle with a teflon coating and the wire stitching employs resistive welding. FIG. 1 is a sectional view illustrating the application of this prior art system which involves three distinct steps, or procedures. In step 1 an upper Tungsten electrode 26 is lowered until the teflon insulation 24 encasing nickel wire 22 is in contact with an etched pad of stainless steel. In step 2 the upper electrode is advanced further against the teflon which breaks at its contact with the stainless steel as well as at its contact with the Tungsten edge. In step 3, a potential is applied across electrodes 26 and 28 causing the nickel wire and the stainless steel to be melted together to form a weld at 30 as a consequence of the excessive heat developed in the resistance at the nickel-stainless steel junction. It will be noted that the current flow between the aluminum electrode and the copper sheet causes little heat because of the high conductivity of both metals. In addition, it should be noted that the teflon flows back into the break at the top and thus is self-healing.

The printed circuit boards according to the Augat system with its special boards have application primarily in the prototype stage. Augat markets a small wire stitching machine for use with its printed circuit boards for approximately two to three thousand dollars which permits placement and attachment of wires by hand. A more expensive semi-automatic machine is available utilizing an x-y table for positioning the printed circuit board. However, the positioning of the wire, the cutting of the wire, the routing of the wire, and other similar operations are performed manually. This system is objectionable for use in the correction of production runs because it requires the use of special boards and is labor intensive.

Two patents which appear to relate to the subject matter of the Augat system have been granted to Larry A. Conley. These are U.S. Pat. Nos. 3,786,172 and 3,850,711. In each of these, a printed circuit board is disclosed which has both copper and stainless steel layers with segments of each exposed enabling solder to be applied on the copper surface, as by wave soldering, and welding to be performed on the stainless steel surfaces. Clearly, a system using this special printed circuit board will not be useful for the correction of other types of existing boards.

SUMMARY OF THE INVENTION

The invention relates to apparatus and methods for correcting existing standard printed circuit boards. The apparatus includes selectively positionable stitching pads formed by a plurality of layers of materials bonded together to form a sandwich-like structure for use with printed circuit boards. The pads include one outer layer of adhesive material of a resin epoxy which will adhere to a surface, such as the face of a printed circuit board, when heat is applied to the pad. Once the epoxy resin has been bonded to a printed circuit board, heat can be applied again without disturbing the bond. The pads include a layer of stainless steel forming all, or part, of the second outer layer of the pad to which suitable wire, such as nickle wire, can be welded, thus enabling connections to be completed through nickel wire between a succession of pads. A layer, or sheet, of copper may be located between the layer, or sheet, of resin epoxy and the layer, or sheet, of stainless steel in a preferred embodiment.

A pad may be of a type called a "pivot pad" herein, consisting simply of layers of each material, with or without intermediate copper and other layers, to enable the epoxy face of the pad to be bonded to a printed circuit board while the opposite face of stainless steel is available for welding to suitable wire so that electrical connections can be made between pads.

A more complex form of pad according to the invention is one called a "connecting pad" herein. A connecting pad is a stitching pad of two or more layers with a hole through the pad along an axis substantially perpendicular to the layers of material. The hole is plated-through with a layer of copper to which a layer of solder (a tin-lead alloy) is bonded. The plated-through copper layer generally is connected to any layers of copper present between the stainless steel and epoxy layers of the pad. The plated through layer of copper and the overlying layer of solder are extended beyond the ends of the hole to form rims of solder-on-copper around the ends of the hole. As a consequence, when solder is applied, as in a flow-solder operation, it will readily form an adhesive bond to the walls of the hole and to connectors on the printed circuit board as well as to terminals of electrical components, when such terminals are positioned in the holes.

Another aspect of the invention relates to apparatus and methods for using positionable stitching pads, which may be pivot pads and/or connecting pads to form new electrical connections on printed circuit boards. It involves apparatus for placing a plurality of positionable pads adhesive-side down in contact with preselected spots on the face of a printed circuit board, heating the pads to cause the heat-responsive adhesive sides thereof to adhere to the face of the board, placing a wire in contact with the stitching side of each pad and applying heat to weld the wire to the pad. Each of the pads may be connected to the others in this way.

Still another aspect of the invention involves the use of connecting pads, i.e. those having plated through holes. For this type of pad, additional apparatus is employed according to a proven method to center the hole in each pad over a preselected hole in a printed circuit board. Additional connections may be completed then, by flowing solder into the holes, between the stainless steel face of the pad and circuitry on the opposite face of the printed circuit board. Connections may also be completed in this way to electrical components, when their terminals extend into the holes.

FURTHER DESCRIPTION OF EXEMPLARY PRIOR ART

Figure 1:
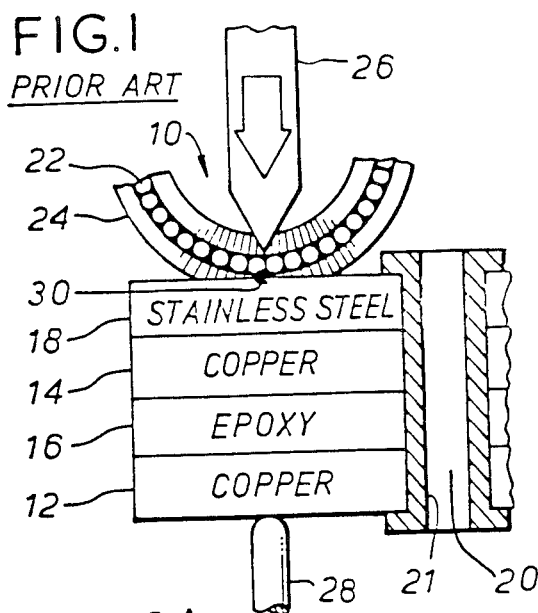
FIG. 1 is a sectional view showing the structure of a prior art printed circuit board of special construction and illustrating how wire is stitched (welded) to the stainless steel surface of such a special printed circuit board.

Turn to FIG. 1 where a sectional view of a portion of a special printed circuit board according to the prior art is shown at 10. This board consists of a sandwich of four layers including two layers, or sheets, of copper 12 and 14 separated by a layer of epoxy 16 with a sheet of stainless steel 18 affixed to one sheet of copper 14. A hole 20 through the printed circuit board is lined by a thin layer of copper 21 which is plated-through the hole for use in mounting electrical components by flow soldering and the like.

In order to stitch, or weld, an insulated wire to the stainless steel surface it is necessary to use wire of suitable materials and follow an effective procedure. In this example, a nickel wire 22, insulated by a layer of teflon 24, is placed in contact with the surface of the stainless steel sheet 18. A Tungsten electrode 26 is placed in contact with the teflon coating and force is applied with the view to rupturing the teflon coating where it contacts the stainless steel surface as well as where it contacts the tungsten electrode. An electrode 28 made of highly conductive material, and preferably of aluminum, is placed against the surface of copper sheet 12.

A low voltage source of electricity having high current capacity is applied across the electrodes 26, 28, causing the nickel wire and the surface of the stainless steel sheet to melt together to form a weld, as indicated by the dark spot at 30. It will be seen that the weld is formed due to the excessive heat developed in the area of the high resistance occuring at the junction of the nickel and stainless steel. The teflon coating has the characteristic property of flowing as it cools so that it flows back into the break to seal insulation over the point of the weld. Very little heat is developed at the junction of the aluminum electrode 28 and the copper sheet since this junction is of very low resistance.

As previously indicated, this prior art apparatus and method are restricted to specially designed printed circuit boards and are not useable in the modification of other printed circuit boards. They are of interest as prior art especially because they illustrate certain principles which apply in the application of the present invention.

DESCRIPTION OF A PREFERRED EMBODIMENT

Figure 2A:
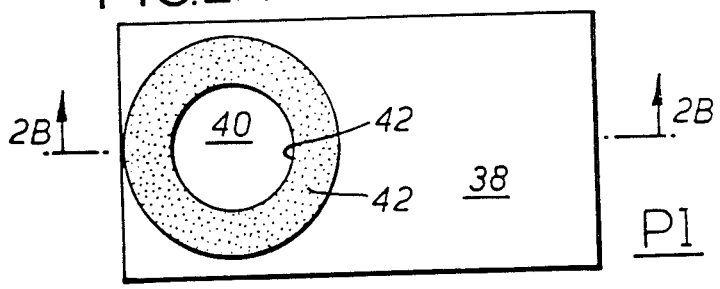
FIGS. 2A and 2B are a top view and a sectional view, respectively, of a stitching pad having a plated-through hole (called a connecting pad herein) in accordance with the invention.
Figure 2B:
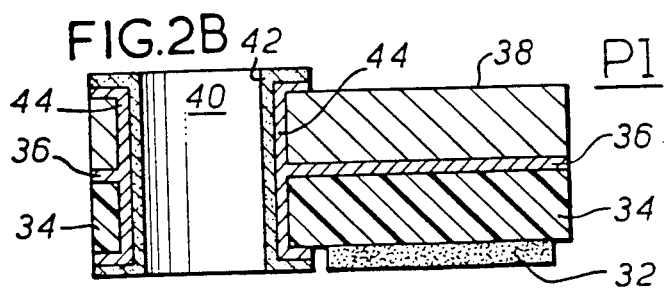

Turn now to FIGS. 2A and 2B for a description of a zero profile soldering and welding pad, herein called a connecting pad, according to the invention. The pads are in the form of a sandwich construction having an adhesive layer in the form of a resin epoxy at 32 which is secured to a layer, or sheet, of epoxy material 34, which in a typical case would be of approximately 100 microns thickness. Attached to the epoxy material, on the side opposite the adhesive, is a layer of copper 36, approximately 15 microns in thickness, and attached to the copper is a stainless steel layer 38 which is approximately 100 microns in thickness. A plated through hole 40 is plated at 42 with an alloy of tin and lead (solder) over a copper layer 44. The plating in the holes is extended beyond the edges of the holes to overlap the face of the epoxy layer 34 and the face of the stainless steel layer 38 by approximately 0.015 inches. In addition to connecting pads through which plated holes are provided, the invention encompasses pivot pads (page 2, FIG. 3) which are like the connecting pads but lack the plated-through holes.

Figure 3:
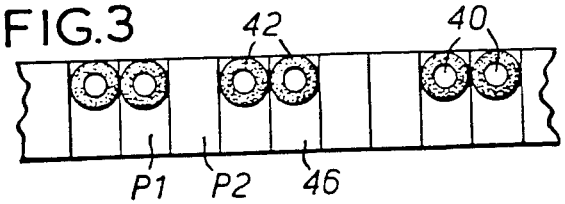
FIG. 3 shows the layout of a preferred arrangement of stitching pads prior to their application to printed circuit boards, where groups of pads having plated-through holes, or connecting pads, alternate with groups of pads without holes, or pivot pads.

Connecting pads P1 such as are illustrated in FIGS. 2A, 2B and pivot pads P2 (with no holes) are provided preferably in a ribbon or strip 46, as indicated in FIG. 3. As shown in this example, connecting pads are grouped in pairs separated by one or two pivot pads. This arrangement was selected as convenient in a particular instance to facilitate cutting pads apart and mounting them on printed circuit boards by use of automatic equipment. It will be recognized, of course, that other arrangements of pivot pads and connecting pads are possible without departing from the spirit of the invention. In a particular case where a large number of printed circuit boards are to be modified, the strip 46 may have the connecting pads and the pivot pads grouped in a different way so that connecting pads to enable connections to the board and pivot pads through which no connections to the board can be made are distributed exactly as needed over the board in a fashion to optimize the operation of apparatus according to the invention.

Figure 4:
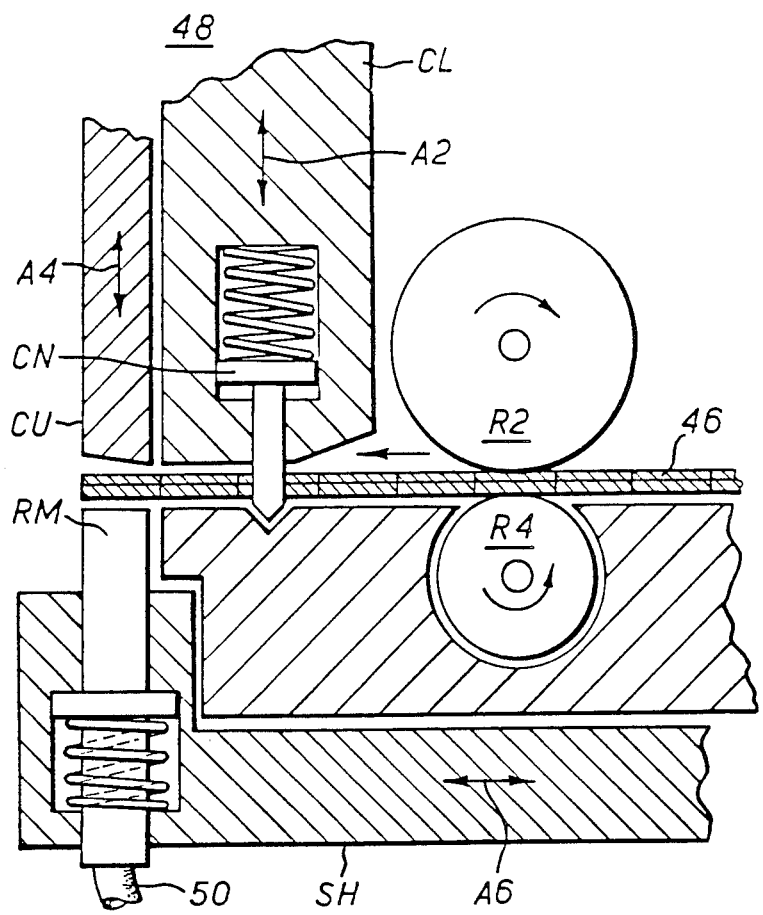
FIG. 4 is a view partially in section showing a pad stamper for separating stitching pads, which are assembled in a ribbon such as that shown in FIG. 3, into separate pads.

The ribbon or strip-of-pads 46 is placed in a pad stamper 48, shown in partial section in FIG. 4, which positions the strip, clamps it, cuts it into individual pads and delivers the individual pads to a spoon holder SH. As indicated in detail in FIG. 4, a strip 46 is positioned between pinch rollers R2, R4 of the pad stamper 48 which advances the strip-of-pads a predetermined distance which may be established by a human operator or by computer means. When a plated-through hole in a pivot pad is positioned appropriately, a centering needle CN may be inserted into the hole to better establish the position of the strip, impede further movement of the strip of positionable pads, and in cooperation with a pad clamper CL, which moves along the line marked by a two headed arrow A2, to clamp the strip in place and permit a pad of predetermined length to be severed from the strip by means of a cutter CU. When a connecting pad is positioned under the centering pin or centering needle, and there is no hole to receive the centering pin, the centering pin remains in the withdrawn position and the pad clamper CL is moved, along the path indicated by the two headed arrow A2, into position against the strip 46 to secure the strip. While the strip is secured a pad of predetermined length is severed from the strip by means of the cutter CU moving along the path indicated by two headed arrow A4.

The severed pad falls on a receiving member, or pad spoon, RM which is supported by the spoon holder SH which, in turn, is movable in the direction indicated by the associated two-headed arrow A6. The receiving member RM is coupled via tube 50 to a source of variable air pressure (not shown) so that it can either hold the pad or repel it.

Figure 5:
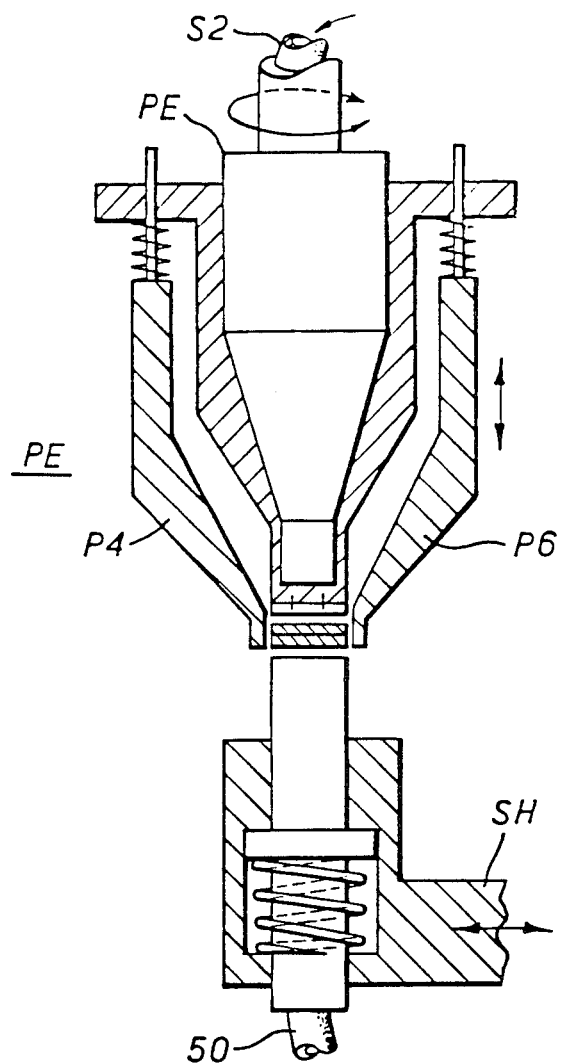
FIG. 5 is a view in partial section of apparatus of use in placing the individual stitching pads in position on a printed circuit board.

The pad is held in place by the receiving member RM making use of low air pressure. The holder SH is then moved in a direction along the horizontal indicated by arrow A6 to transport the pad to a position near a positioner PE as indicated in FIG. 5. When the pad is in place beneath the positioner, air pressure is reversed through 50 to lift the pad off of the pad spoon RM and a vacuum is applied through 52 to lift the pad into contact with a pasting electrode PE. Pad holders at P4, P6 are then urged, by means not shown, into contact with the pad to hold it.

A printed circuit board is then mover under the positioner containing the positionable pad with the movement of the printed circuit board being coarsely determined by an x-y table or other positioning means, and the fine positioning being accomplished with the use of a light beam and a four-quadrant sensor. If the pad is a connecting pad (with a plated-through hole) the light beam is used to position the selected plated-through hole of the printed circuit board in line with the plated-through hole of the positionable pad to ensure the alignment of both plated-through holes. If the pad is a pivot pad (with no plated-through hole) its position on the printed circuit board is determined with sufficient accuracy by the x-y table. In either case, the positionable pad is then affixed to the printed circuit board by utilizing pressure and two electrodes to cause a current flow. The flow of current develops heat in the positionable pad and causes the adhesive on the positionable pad to bond to the printed circuit board.

Figure 6:
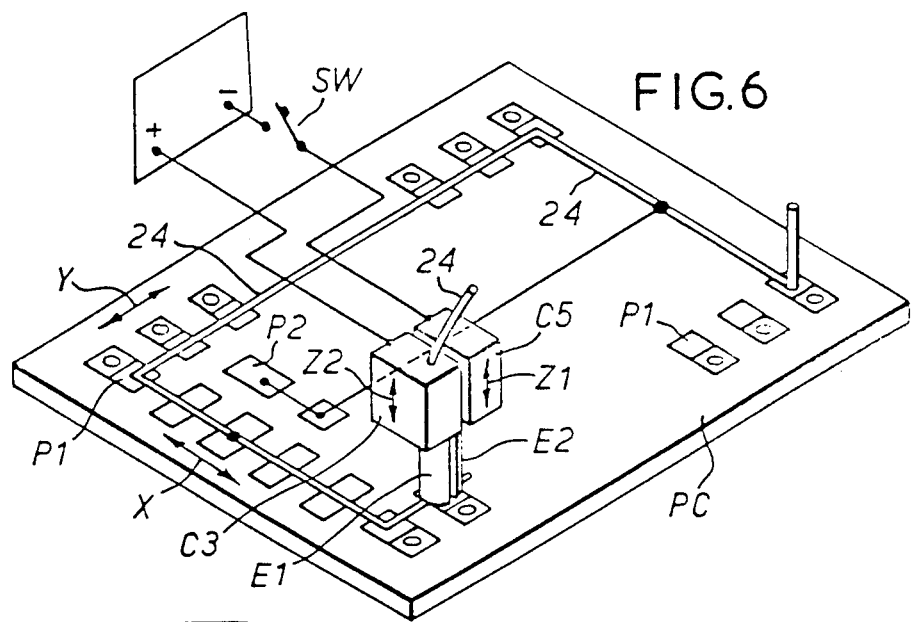
FIG. 6 is a view in perspective showing a printed circuit board supported on an x-y table, with a number of stitching pads affixed to the board and with welding equipment in position to stitch wire to the pads.

FIG. 6 represents a printed circuit board positioned on an x-y table showing a plurality of connecting pads P1 and pivot pads P2 secured to the printed circuit board and interconnected by wires in accordance with further principles of the invention. As indicated above, the pads P1 and P2 are secured to the board when electricity is applied across two electrodes contacting one face of the pad and producing heat to fuze the adhesive epoxy to the printed circuit board. The blocks C3, C5 shown in FIG. 6, as will be explained more fully below, terminate in electrodes E1, E2 of use in stitching wire to the pads P1, P2. It will be understood, however that these electrodes, one of which may be the pasting electrode PE, may be used to heat a pad for the purpose of causing the adhesive epoxy, and thereby the pad, to adhere to the printed circuit board.

Figure 7:
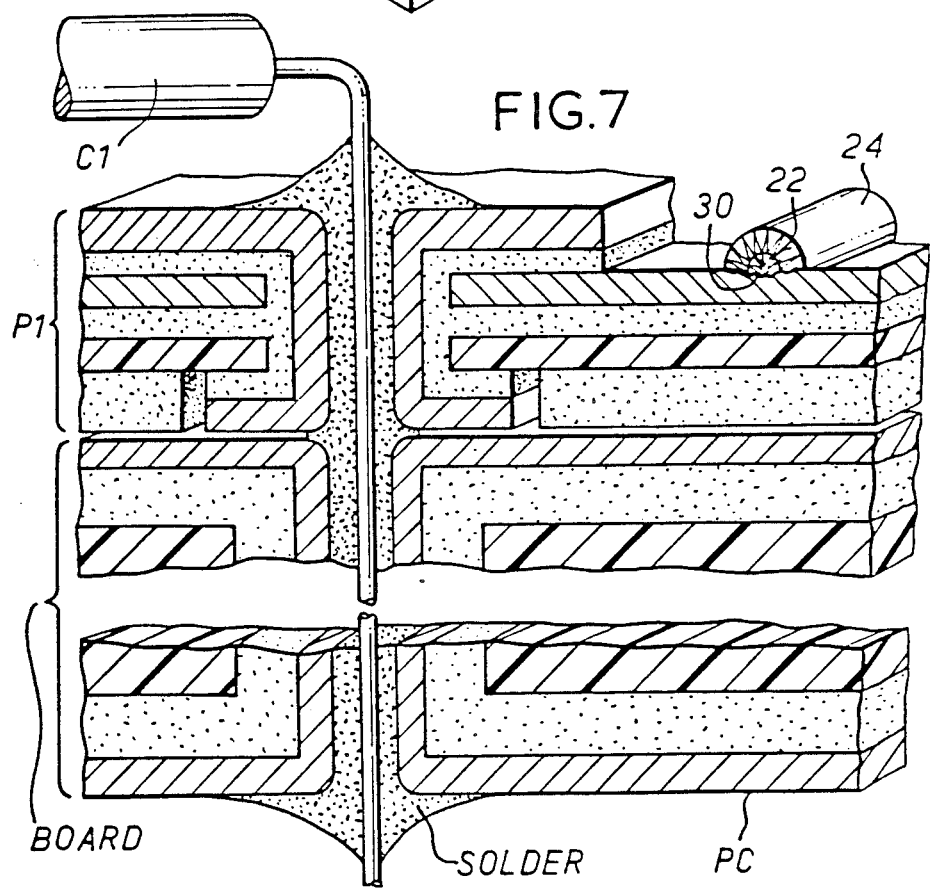
FIG. 7 is a sectional view of a printed circuit board, showing a stitching pad in place on the board, a component inserted through and soldered into a plate-through hole, and a nickel wire stitched (welded) to the stainless steel face of the pad.

FIG. 7 illustrates a sectional view through a printed circuit board PC and an associated connecting pad, P1 on the board. A component C1 is shown in position where it has been inserted through and soldered into a plated-through hole which extends through the PC board and the pad. A nickel wire 22 is shown stitched (welded) to the stainless steel face of the pad. Other connections, not shown, may be completed to the solder on the lower side of the PC board using conventional flow-solder techniques.

METHOD OF STITCHING WIRE TO PADS

Figure 8:
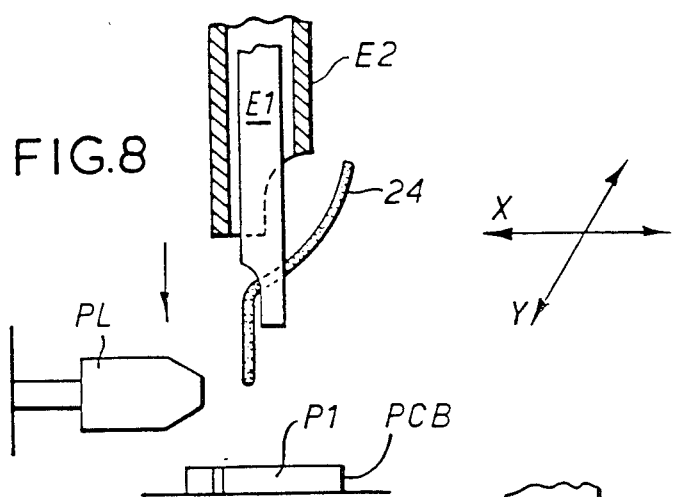
FIGS. 8–15 illustrate a series of steps employed in positioning wire, stitching wire and cutting wire to add new connections to a printed circuit board.

A preferred method, in accordance with the invention, for preparing wire for stitching (welding) and then stitching wire to positionable pads is shown in FIGS. 8-13. This method includes the following steps:

1. As shown in FIG. 8, a wire positioner comprised of two electrodes E1, E2, the first electrode E1 (the inner electrode in the drawing) being preferably of Tungsten and the second electrode E2 (the outer electrode in the drawing) being preferably of aluminum or copper, positions the wire over the positionable pad P1.

Figure 9:
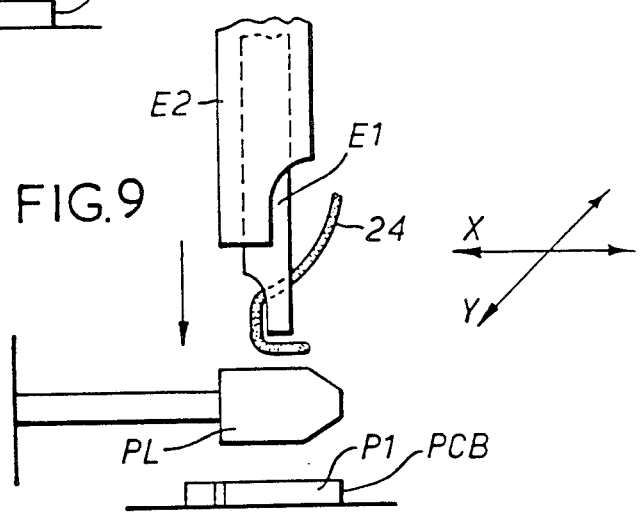

2. As the first electrode E1 (which carries the wire) moves toward the positionable pad as seen in FIG. 9, a movable plunger PL is moved toward the right, as shown, causing a right angle to be formed in the wire and positioning the wire between the end of the first electrode and the positionable pad.

Figure 10:
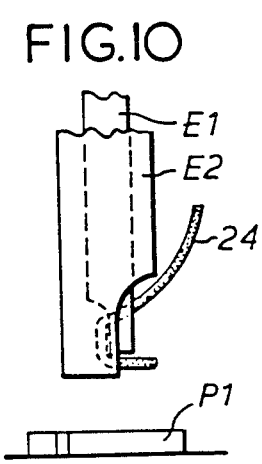

3. As shown in FIG. 10, the second electrode E2 is lowered then until it extends over the end of the first electrode E1.

Figure 11:
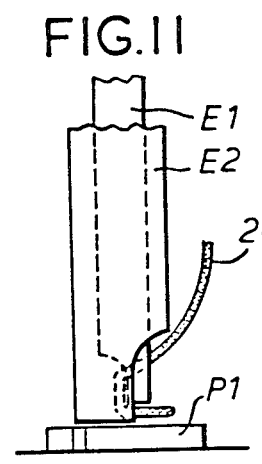

4. As shown in FIG. 11, the electrodes are lowered together then until the second electrode E2 comes into contact with the positionable pad P1.

Figure 12:
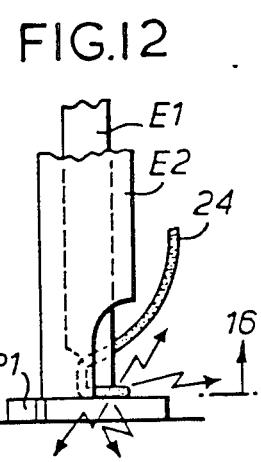

5. As shown in FIG. 12, the first electrode E1 is lowered then into contact with the positionable pad, with the wire interposed between the positionable pad and the first electrode. A sufficient force is then applied to mechanically break the insulation on the wire.

6. With the electrodes positioned as in FIG. 12, current flow is initiated then between the first electrode and the second electrode of sufficient magnitude to resistance weld the nickel wire to the stainless steel surface of the positionable pad.

Figure 13:
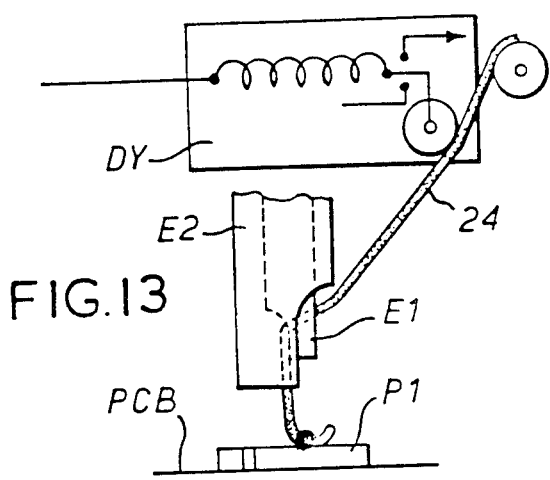

7. In FIG. 13, the first and second electrodes are shown after being removed from the positionable pad. In this view, apparatus is indicated at DY for detecting and measuring the motion of the wire.

Figure 14:
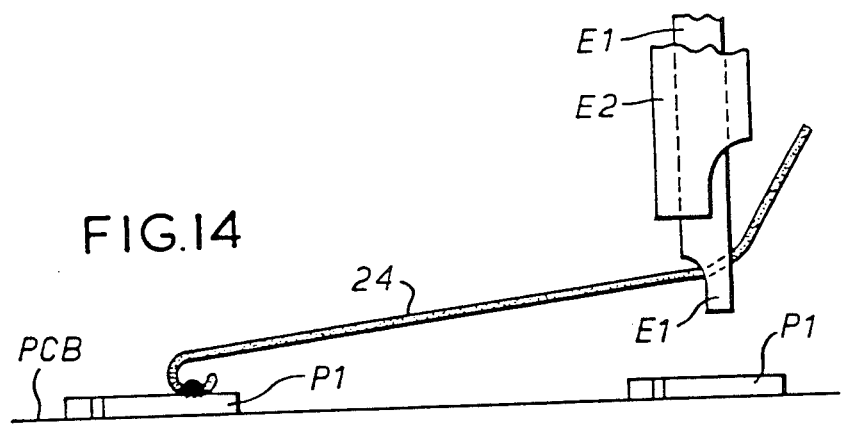

8. In FIG. 14, the wire is shown being routed by electrode E1 which carries the wire to a succession of positionable pads where steps one through six are repeated in order to stitch the wire to each pad.

Figure 15:
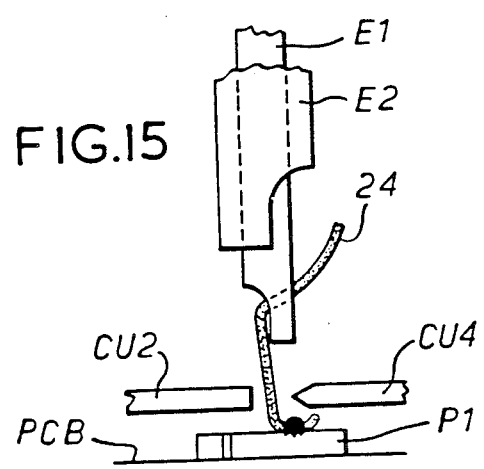

9. As a final step, after the wire connections have been made to all the pads, the wire is cut by cutter means indicated at CU2, CU4 in FIG. 15.

Figure 16:
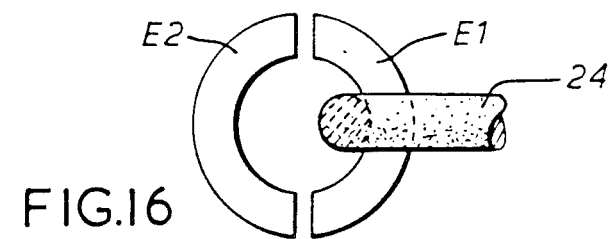
FIG. 16 shows the configuration of electrodes E1 and E2 and the relationship of E1 to the wire 24.

A further showing of the relationships between the electrodes E1 and E2 and the wire is indicated in FIG. 16, which represents an enlarged view of the tips of the electrodes E1, E2 with wire 24 extending over the end of E1 as they would appear from a vantage point along line 16—16 near the face of the pad in FIG. 12.

In the practice of this invention, a voltage of less than two volts and about 60 joules of energy is utilized for resistance welding. The energy to weld is dissipated through the electrodes by discharging a capacitor. The amount of energy is voltage and time dependent based upon the materials utilized.

Figure 17:
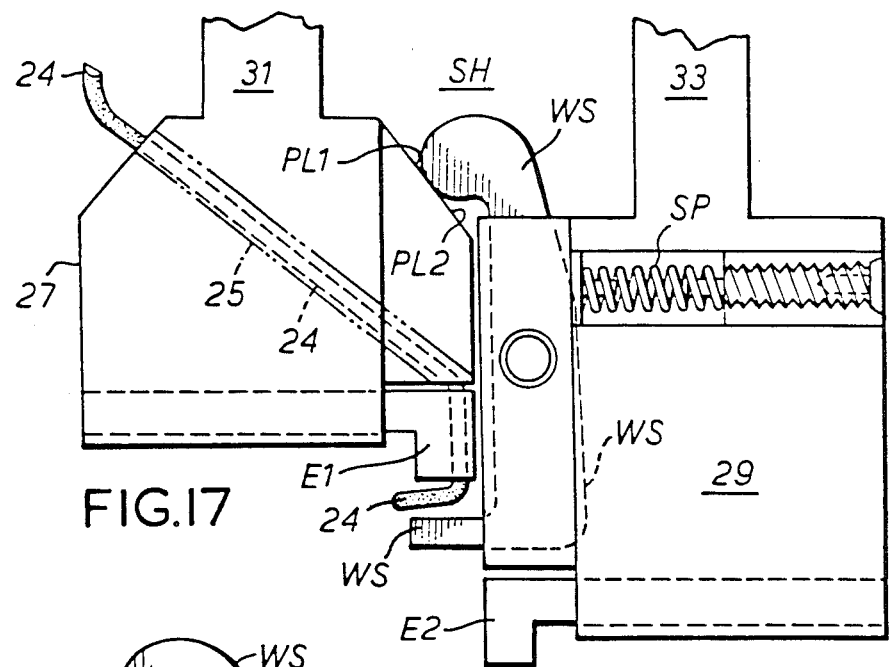
FIG. 17 is an elevation showing details of construction of a preferred stitching head, according to the invention, which may be employed in the performance of the operations shown schematically in FIGS. 8–15.

FIG. 17 is an elevation showing details of a preferred stitching head of use in performing the operations set forth schematically in FIGS. 8–15.

In FIG. 17, the Tungsten electrode E1 and aluminum electrode E2 are shown in a position corresponding to that of FIG. 9 (but as a mirror image). In this view, a wire shooter WS serves the same purpose as the plunger PL of FIG. 9. It will be seen that a camming surface at PL1 engages a cam at PL2 which causes the wire shooter to move against a mechanical bias provided by a spring SP to bend the wire 24 as indicated. The wire 24 is fed through a needle hole 25 in the slab holder 27 and out through the electrode E1, as shown. A slab holder 29 supports the electrode E2 and the wire shooter WS. The slab holders, in a preferred embodiment, are positioned by air pressure systems operating through cylinders the shafts of which are indicated at 31 and 33.

Figure 18:
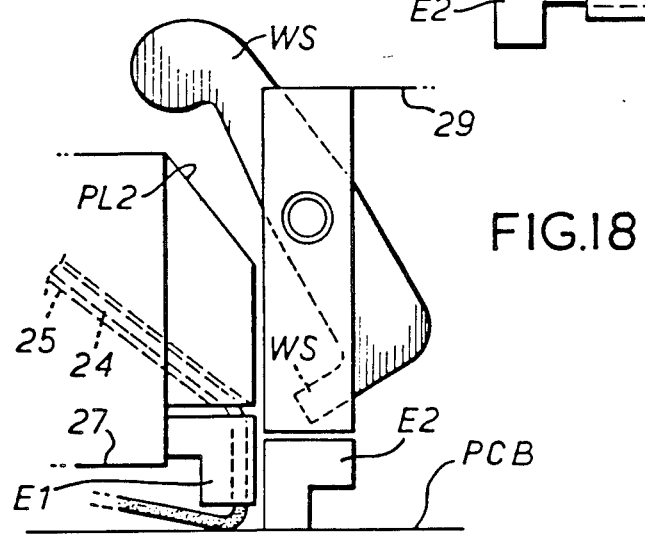
FIG. 18 shows a portion of the stitching head according to FIG. 17 as it would be positioned for welding.

FIG. 18 is a representation of a portion of the stitching head showing the electrodes E1 and E2 in a portion corresponding to that of FIG. 12 while stitching, or welding, is performed. The electrodes in both FIG. 18 and FIG. 12 occupy the relative positions, side-by-side, indicated in FIG. 16.

The foregoing apparatus may be controlled by a microprocessor which relies on inputs from various actuators and sensors and is responsive to instructions stored in RAMS or ROMS. The microprocessor may also receive instructions from a datacom which is connected to a central processor and from a floppy disk. The software contained on the floppy disk is software unique to the printed circuit board being worked upon as it defines the exact location of wires, routings, etc.

According to a first method of operation, the positioning of the positionable pads and the wire stitching may be controlled manually using a joy stick or the joy stick may be utilized to create software to effect control. A second method may make use of a graphic terminal which utilizes the data for the printed circuit board and displays the actual artwork. By employing a cursor, the positionable pad and wire can be positioned, routed and terminated graphically. Once the operator is satisfied with the graphic corrections, such corrections, after being subject to certain review techniques and procedures, would be implemented in software. The positioning may also be automatically performed through use of a design file which compares the design with subsequent revisions; accordingly, the entire procedure can be automated.

Other enhancements and improvements include replacing the x-y table with a robot control to provide a completely unattended machine. A further improvement is to provide a coating or abrasive tool for the purpose of removing or breaking existing connections on a printed circuit board, thereby permitting non-additive changes in the same operation.

What is claimed is:

1. An apparatus for use in changing electrical connections on printed circuit boards, comprising:
   a selectively positionable stitching pad including a plurality of layers of materials bonded together to form a sandwich-like structure, a first face of said pad including a layer of adhesive material, a second face of said pad including a layer of electrically conductive weldable material; and
   heating means for bonding said pad to the surface of a printed circuit board, said heating means further for stitch welding a wire to said layer of weldable material, said heating means including
   first heat means for passing a first electric current through said layer of weldable material sufficient to cause application of heat at a first predetermined level to said adhesive material to bond said pad to said board, and
   second heat means, responsive to completing the bonding of said pad to said board, for passing a second electric current through said layer of weldable material sufficient to cause application of heat at a second predetermined level to said weldable material to stitchweld said wire to said layer of weldable material.

2. The apparatus according to claim 1 wherein:
   said first heat means includes first and second electrodes, said first and second electrodes both in electrical contact with said weldable layer, said first electric current passed between said first and second electrodes;
   said second heat means includes said first and second electrodes, said first electrode in electrical contact with said wire, said wire in electrical contact with said weldable layer, said second electrode in electrical contact with said weldable layer, said second electric current passed between said first and second electrodes.

3. The apparatus according to claim 2 wherein said first face of said pad is in contact with said surface of said printed circuit board.

4. The apparatus according to claim 1 wherein said first face of said pad is in contact with said surface of said printed circuit board

* * * * *